(12) United States Patent  
Joshi et al.

(10) Patent No.: US 7,376,001 B2  
(45) Date of Patent: May 20, 2008

(54) ROW CIRCUIT RING OSCILLATOR METHOD FOR EVALUATING MEMORY CELL PERFORMANCE

(75) Inventors: Rajiv V. Joshi, Yorktown Heights, NY (US); Qiuyi Ye, Hopewell Junction, NY (US); Yuen H. Chan, Poughkeepise, NY (US); Anirudh Devgan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/250,019

(22) Filed: Oct. 13, 2005

(65) Prior Publication Data

US 2007/0086232 A1    Apr. 19, 2007

(51) Int. Cl.  
*G11C 11/00* (2006.01)

(52) U.S. Cl. .................. 365/154; 365/233; 365/156

(58) Field of Classification Search ............... 365/154, 365/233, 156, 63, 72, 205, 190, 194, 204, 365/189.04, 230.03  
See application file for complete search history.

(56) References Cited

U.S. PATENT DOCUMENTS

| | | | |
|---|---|---|---|
| 5,687,178 A | 11/1997 | Herr et al. | |
| 5,781,469 A * | 7/1998 | Pathak et al. | 365/156 |
| 6,452,459 B1 | 9/2002 | Chan et al. | |
| 6,600,680 B2 * | 7/2003 | Sell et al. | 365/189.09 |
| 6,958,659 B2 | 10/2005 | Nakajima | |
| 7,071,736 B2 | 7/2006 | Wikstrom | |
| 7,099,182 B2 | 8/2006 | Ohtake et al. | |
| 7,142,064 B2 * | 11/2006 | Chan et al. | 331/57 |
| 7,190,233 B2 | 3/2007 | Bhushan et al. | |
| 2004/0061561 A1 | 4/2004 | Monzel et al. | |
| 2005/0063232 A1 | 3/2005 | Chan et al. | |
| 2005/0078508 A1 | 4/2005 | Chan et al. | |
| 2005/0204211 A1 | 9/2005 | Gouin et al. | |
| 2006/0050600 A1 * | 3/2006 | Venkatraman et al. | 365/233 |
| 2006/0097802 A1 | 5/2006 | Chan et al. | |

OTHER PUBLICATIONS

U.S. Appl. No. 11/077,313, Joshi et al.

(Continued)

*Primary Examiner*—Richard T. Elms  
*Assistant Examiner*—Dang Nguyen  
(74) *Attorney, Agent, or Firm*—Mitch Harris, LLC; Andrew M. Harris; Casimer K. Salys

(57) ABSTRACT

A method for evaluating memory cell performance provides for circuit delay and performance measurements in an actual memory circuit environment. A ring oscillator implemented in a row of memory cells and having outputs connected to one or more bitlines along with other memory cells that are substantially identical to the ring oscillator cells is operated by the method. Logic may be included for providing a fully functional memory array, so that the cells other than the ring oscillator cells can be used for storage when the ring oscillator row wordlines are disabled. One or both power supply rails of individual cross-coupled inverter stages forming static memory cells used in the ring oscillator circuit may be isolated from each other in order to introduce a voltage asymmetry so that circuit asymmetry effects on delay can be evaluated.

12 Claims, 6 Drawing Sheets

OTHER PUBLICATIONS

U.S. Appl. No. 11/250,061, filed Oct. 13, 2005, Kuang et al.
U.S. Appl. No. 11/609,598, filed Dec. 12, 2006, Ehrenreich et al.
U.S. Appl. No. 11/682,542, filed Mar. 06, 2007, Carpenter et al.
U.S. Appl. No. 11/781,994, filed Jul. 24, 2007, Kuang et al.

* cited by examiner

ROW CIRCUIT RING OSCILLATOR METHOD FOR EVALUATING MEMORY CELL PERFORMANCE

CROSS-REFERENCE TO RELATED APPLICATION

The present application is related to co-pending U.S. patent application "METHODS AND CIRCUITS FOR EVALUATING STATIC MEMORY CELL DYNAMIC STABILITY", Ser. No. 11/225,652, filed on Sep. 13, 2005 and "BITLINE VARIABLE METHODS AND CIRCUITS FOR EVALUATING STATIC MEMORY CELL DYNAMIC STABILITY", Ser. No. 11/225,571, the applications having at least one common inventor with the present application and are assigned to the same Assignee. The entire disclosures of the above-referenced applications are incorporated herein by reference.

The present application is also related to U.S. patent application "CASCADED TEST CIRCUIT WITH INTER-BITLINE DRIVE DEVICES FOR EVALUATING MEMORY CELL PERFORMANCE", Ser. No. 11/250,061, filed concurrently herewith and assigned to the same Assignee.

BACKGROUND OF THE INVENTION

1. Technical Field

The present invention relates generally to memory circuits, and more particularly to a ring oscillator circuit and method for evaluating memory cell performance.

2. Description of the Related Art

Memory speed and other performance factors are critical limitations in today's processing systems and are predicted to become even more of a critical limitation as technologies move forward. In particular, static random access memories (SRAMS) and memory cells are used in processor caches, registers and in some designs external to the system processors for fast access to data and program instructions.

With processor cycle frequencies reaching well above 4 Ghz, development of SRAM cells that can store and provide access to stored values within that period has become necessary. However, measuring operating performance of memory cells in the presence of actual loading conditions presents a challenge.

Memory cell transition times, along with many other digital circuits have been evaluated using ring oscillator circuits wherein a large number of cells are cascaded with feedback of the output arranged in a ring configuration. The frequency at which the ring oscillator operates indicates the transition time performance, which provides some measure of ultimate operating frequency and access times. Typically, the cell design is then changed iteratively in response to the results of the ring oscillator test.

However, present ring oscillator circuits and tests typically either are not applied on production dies or they do not test the memory cells under loading conditions identical to placement of the cells within an actual memory array.

It is therefore desirable to provide a ring oscillator circuit and method for evaluating memory cell design under actual operating load conditions. It is further desirable to provide such a ring oscillator circuit that can be selectively enabled on production dies so that on-going evaluation during the production life span of a memory design can be performed.

SUMMARY OF THE INVENTION

The objective of evaluating memory cell designs under actual loading conditions is accomplished in a circuit that can be selectively enabled in a production die and method of operation of the circuit.

The circuit is a memory array that incorporates a ring oscillator of memory cells within a row of the array. The number of stages of the ring oscillator is generally equal to the number of cells within a row. Each stage of the ring oscillator is connected to the memory array just as a standard member of the corresponding column, i.e., each cell has its input/output connections coupled to bitlines of a corresponding column. The circuit under test may be a 6 transistor static random access memory SRAM cell with a pair of cross-coupled back-to-back complementary transistor inverters and with a series word/bit-line transmission control transistor between the output of each inverter and the corresponding word/bit-line or the cell may be a different design or different type of memory cell.

An asymmetry may be introduced in one or more of the ring oscillator cells, which may be a different power supply voltage supplied to each of a pair of inverters implementing the cell. Effects of leakage on delay be measured by adjusting the values of the other memory cells via a test method that studies changes in the ring oscillator frequency as the states of the other cells are varied.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a ring oscillator circuit for evaluating performance of memory cells and memory arrays in order to facilitate design improvement and determination of operating margins. In particular, a ring oscillator is implemented in a row of a memory array, which may be a production memory array tested for ongoing product analysis or a test memory array implemented and tested for laboratory analysis. The oscillator row is connected within a memory array just as other rows: the input/output connections of the memory cells in the oscillator row are connected to their corresponding column bitlines. One or more internal nodes of each of the ring oscillator cells may be connected to previous bitline(s) to propagate a logic state change from the previous bitline(s) through the cell to the output bitline(s). The passgates have enable inputs connected to the outputs of the opposite internal state output of the cell, so that when the state of one of the inverter outputs of the cell is in the logical low state, the corresponding pass gate is enabled. Alternatively, only nodes external to the pass transistors may be connected to the bitlines or an internal point in the sense amplifier, the output of the sense amplifier or a later point in the memory device output stage may be used to provide the inputs to a next pair of bitlines, so that more of the memory device read circuit is measured for variation using the ring oscillator.

The loading experienced by the cells in the oscillator is identical to that of an ordinary storage row, providing an accurate measure of the delays of the memory cells in an actual memory array implementation. The ring oscillator can be selectively enabled in a test mode, so that production dies can include the ring oscillator row for ongoing process and design evaluation.

Figure 1:
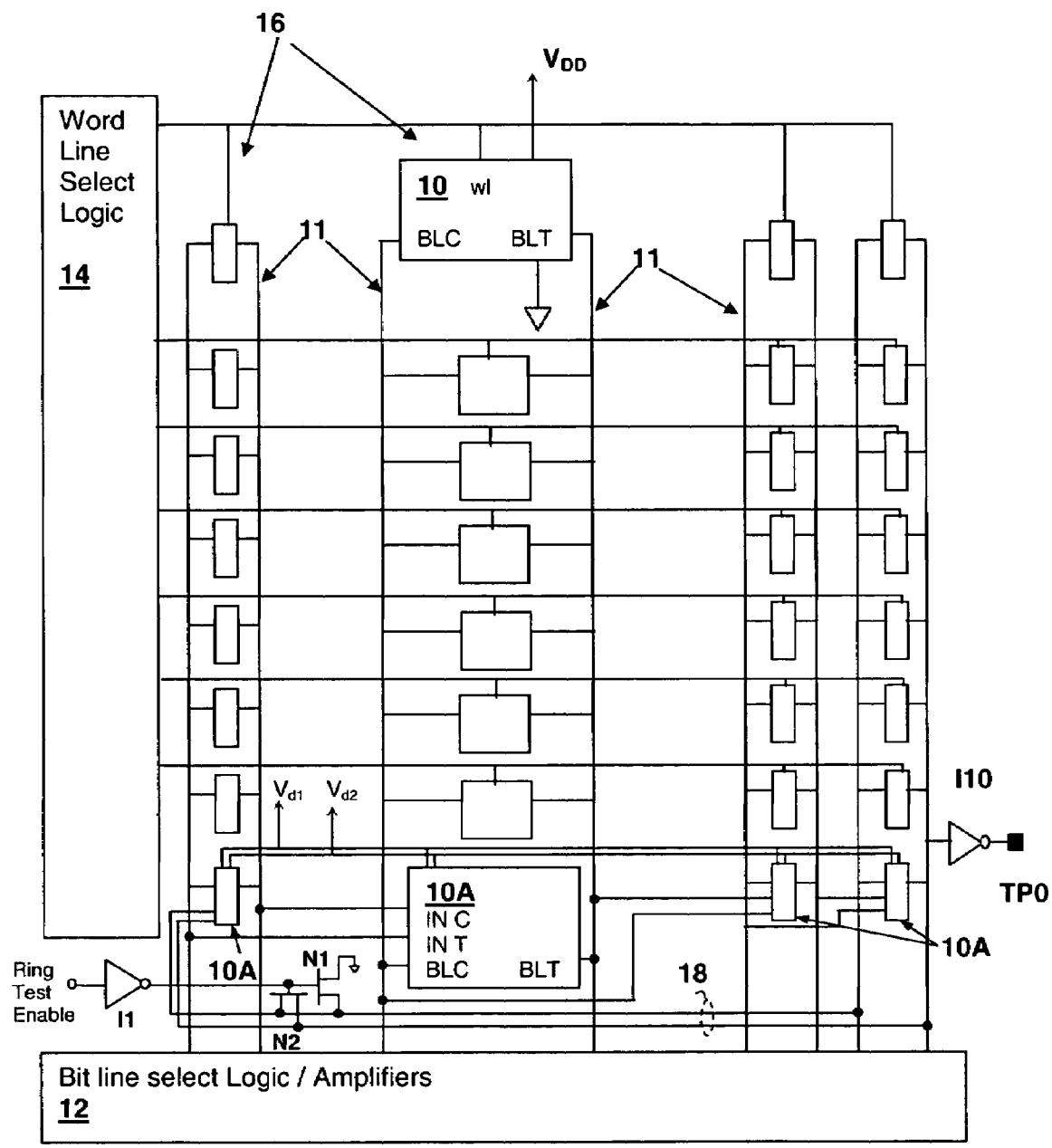
FIG. 1 is a schematic diagram of a memory array in accordance with an embodiment of the invention.

With reference now to the figures, and in particular with reference to FIG. 1, a memory array in accordance with an embodiment of the invention is shown. The memory array includes multiple memory cell columns 16 assembled from memory cells 10 and additionally, at least one test row that is made from ring oscillator memory cells 10A. Each given ring oscillator memory cells 10A supports propagation of state changes on bitlines 11 of a previous column 16 to the bitlines 11 corresponding to the column 16 of the given ring oscillator memory cell 10A. The ring oscillator memory cell 10A of the first column 16 has internal input nodes that receive connections 18 from bitlines 11 of the last column 16, so that the ring is closed. Only four stages are shown in the figure for simplicity, but an actual implementation will match the number of memory cells in a row of a production memory array and will generally be much larger. Also, a net inversion must be provided around the ring, so that the ring oscillator will oscillate. For this purpose, the complement input IN C of each ring oscillator cell 10A is shown connected to the true bitline output BLT of the previous cell and similarly for the complement bitlines BLC and true inputs IN T. A non-inverting connection can be alternatively made between each stage of the ring oscillator as long as an inverter is inserted somewhere in the ring. The extra inverter can either be characterized and included in the frequency calculations, or can be regarded as negligible if its delay is short with respect to the ring oscillator period. The ring oscillator output is generally buffered by a buffer or inverter I10 from one of the bitlines (or differentially buffered from a bitline pair) and provided on a test pad output TP0 for access by a wafer test fixture.

The remainder of the memory array can be made similar to standard memory arrays, with the exception of test logic provided within the control logic to select the ring oscillator frequency generation mode, which enables the common wordline connections as shown from the Ring Test Enable signal which, when enabled, turns off a transistor N1 via an inverter I1. Transistor N1 sets an initial condition of a logical low state on the first cell's complement input when enabled and the condition is removed when the Ring Test Enable signal is asserted. Inverter I1 also turns on a transistor N2 that connects the rings formed around the complement path and non-complement path across the ring enabling the ring oscillator to operate. The cells in other rows of a test array may be dummy cells without logic to select them for reading or writing. However, even in test environments, the leakage/loading test methodologies detailed hereinafter below make it desirable to have some means of altering the internal states of memory cells outside of the row of cells 10A that implement the ring oscillator, so that worst-case/best-case conditions may be tested.

Bitlines 11 may also be connected to a bitline select logic/sense amplifiers 12 block that selects the appropriate column output and provides the value of the memory cell to external circuits in response to a memory read operation. The row is selected by a particular word line asserted from a word line select logic 14. Word line select logic 14 and bitline select logic/sense amplifiers 12 are only needed in complete form for operationally functional memory arrays and a test memory array can be constructed without the complete functionality of a production memory array. However, to perform all of the tests that will be described below, the ability to write all memory cells 10 is needed. However, writing can be performed via boundary scan circuits or other techniques that do not require the full read/write access logic of a production static memory array.

The memory array of FIG. 1 may also include split power supply connections to one or more of ring oscillator memory cells 10A, which are shown as $V_{D1}$ and $V_{D2}$. The cells used in the ring oscillator are as shown in the detailed depiction of one embodiment of memory cell 10A in FIG. 2A or 2B, which is described below. In a manner similar to that described in the above-incorporated co-pending patent application, an asymmetry can be introduced and its effect on performance of the memory array measured. In the context of the present invention, that performance is delay in general rather than stability, but the same principles of varying the voltage of the cell or other characteristic to simulate actual cell device parameter variation is applied. The leakage test methodology described in the above-incorporated U.S. Patent Application also applies to the delay measurements described herein, but the loading technique of shorting columns does not apply directly to the present invention, as the ring oscillator would be altered if stages were shorted. However, additional column loads could be provided and switched in, generally in a test circuit, so that the effect of variable loading on ring oscillator frequency could be evaluated.

Figure 2A:
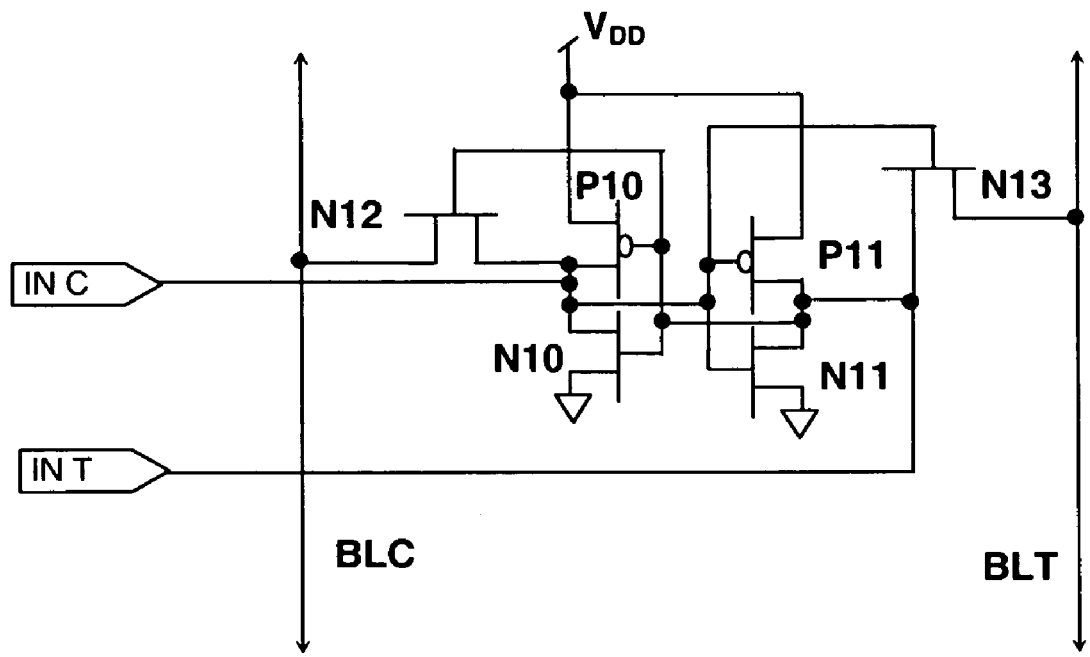
FIG. 2A is a schematic diagram of a ring oscillator memory cell in accordance with an embodiment of the present invention.

Referring now to FIG. 2A, details of test memory cell 10A of FIG. 1 are shown in accordance with an embodiment of the invention. Transistors P10, N10, P11 and N11 form a static latch that provides the storage of a value in the cell via a pair of cross-coupled inverter stages. Transistors N10 and P10 form one inverter stage and transistors N11 and P11 form the other inverter stage. Transistors N12 and N13 are enabled by the internal state output of the inverter stages and provide for writing a logical low level to the bitline connected to the particular enabled transistor N12 or N13 for each cell, depending on the state of the cell. The bitlines that are not driven are set high by the pre-charge or other logic, so that the ring oscillates by virtue of the writing action across the row when the ring oscillator is enabled in test mode. Bitlines BLT (true bitline) and BLC (complement bitline) couple all cells in a column, so that when the Ring Test Enable signal is not enabled, another row may be selected and only one row memory cell 10 from each column 16 is exposed to the memory logic. Internal nodes of the cross-coupled inverters formed by transistors N10, P10 and transistors N11, P11 are coupled to the previous column bitlines as described above, so that the internal storage state of ring oscillator cells 10A is always following the bitline value of the previous column. When the ring oscillator row is enabled (ring oscillator test mode), then the inverted state of the previous column bitline is imposed on the given column bitline by ring oscillator cell 10A through one of pass transistors N12 and N13 after the delay of the ring oscillator cell has elapsed and the actual delay in charging the bitlines is also observed in conjunction with the drive level of ring oscillator cell 10A, so that the delay is representative of the actual delay of a memory memory cell 10.

For a normal read operation, the bitlines BLC and BLT are previously charged to opposite state predetermined voltages (generally $V_{DD}$ and ground), and to commence the read, the wordline of the cells in the row is pulsed and a sense amplifier coupled to bitlines BLC and BLT determines the stored state by differential comparison of bitlines BLC and BLT. The present invention provides a mechanism that can measure the read delay directly and the column bitlines can be precharged as usual, or may be left floating to determine the delay from half select mode.

While the illustrated cell is an example of a cell of order 4 that may be analyzed and improved by a method according to an embodiment of the invention, it should be understood that the ring oscillator row measurement illustrated herein may be applied to static or dynamic memory cells of any order.

As pointed out above, ring oscillator cell 10A differs from typical memory cells (and the other memory cells 10 in the memory array of FIG. 1) in that internal nodes are connected to bitlines of the previous column in order to provide a ring oscillator and pass transistors N12 and N13 have gates connected to the opposite side inverter output. In other respects ring oscillator cell 10A is identical to memory cells 10, so that the performance of memory cells can be determined.

Figure 2B:
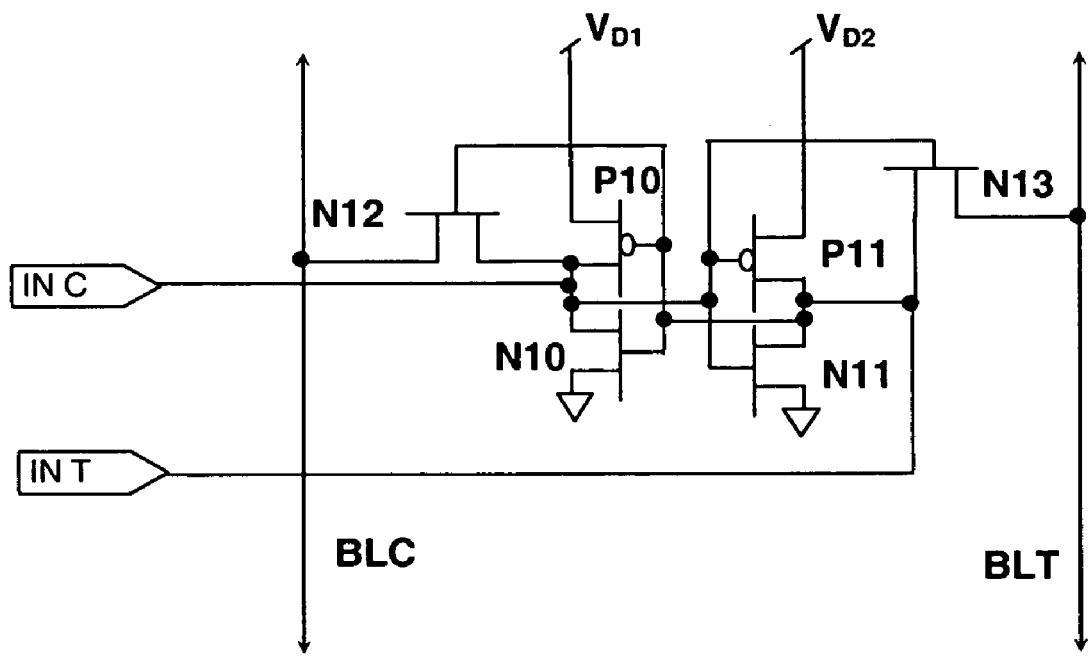
FIG. 2B is a schematic diagram of a ring oscillator memory cell in accordance with another embodiment of the present invention.

However, as mentioned above with respect to the above-incorporated U.S. Patent Application, and as shown in FIG. 2B, ring oscillator cell 10A may be provided in accordance with another embodiment of the present invention. In the depicted embodiment, separate power supply connections $V_{d1}$ and $V_{d2}$ are provided so that a different voltage that is generally lower than $V_{DD}$ can be supplied to at least one of the inverters forming one or more of ring oscillator cells 10A for observing changes in the delay characteristics of ring oscillator cell(s) 10A when the asymmetry is varied.

One of power supply connections $V_{d1}$ and $V_{d2}$ may be connected to the $V_{DD}$ power supply rail that supplies the remainder of the memory array. Also, or in the alternative, the ground connection to test cell 10A can be isolated. In essence, the isolation of at least one of the power supply rails supplying at least one of the cross-coupled stages that provides the storage latch within test memory cell 10A permits varying the voltage swing at the input of the other stage.

Changing the output voltage of one of the inverters introduces an asymmetry that simulates conditions that occur due to asymmetry in devices making up the memory cells that can cause excessive delay in a memory cell read operation or actually cause the state of a memory cell to toggle when read. In the latter case, an improper toggle could result in no oscillation from the ring oscillator, as the condition of logical inversion around the ring would be at least momentarily violated.

In particular, with respect to ring oscillator cell 10A as depicted in FIG. 2A and in FIG. 2B, when the stored value is a logical "0" (with respect to the bitline values), the common channel connection of transistors P10 and N10 is near ground. During a read operation, if transistor N11 is weak and transistors P11 and/or N13 are strong, the read operation can change the state of the cell, if the capacitance of bitline BLT is high and a positive precharge voltage is present on bitline BLT at the moment transistor N13 is enabled. Similarly, the relative strengths and weaknesses of the above-listed transistors affect the read delay of ring oscillator cell 10A. When the value stored in the memory cell is a logical "1", the critical transistor sets are reversed, with variations of transistors N10, N12 and P10 causing potential failure of the read operation. Referring again to FIG. 2B, the above conditions can be simulated by reducing voltage $V_{D1}$ while maintaining voltage at full $V_{DD}$ and reading oscillator cell 10A using a pulse width consistent with the normal access times of memory cell 10.

Another effect that can change the performance of memory cells 10 and ring oscillator cells 10A is the effect of leakage from other non-enabled cells 10 connected to the column bitlines (i.e., those memory cells 10 in other rows of FIG. 1). Depending on the voltage present on the opposite side of the pass transistors that connects each memory cell 10 to the bitlines, the leakage polarity will differ, and therefore the states of the memory cells connected to the same bitlines can change the performance of ring oscillator cells 10A. The method of the present invention includes algorithms to vary the bitline values on non-enabled cells in order to determine their effect on ring oscillator cell 10A performance. Thus the present invention includes leakage tests as contemplated by the above-incorporated U.S. Patent Application. However, for loading tests, the columns cannot be shorted together in the manner described in the above-incorporated U.S. Patent Application, as the ring oscillator would be shortened. Therefore, in order to study loading effects, multiple circuits can be implemented, or additional loading rows can be switched containing memory cells 10 that are not part of other columns.

Figure 3:
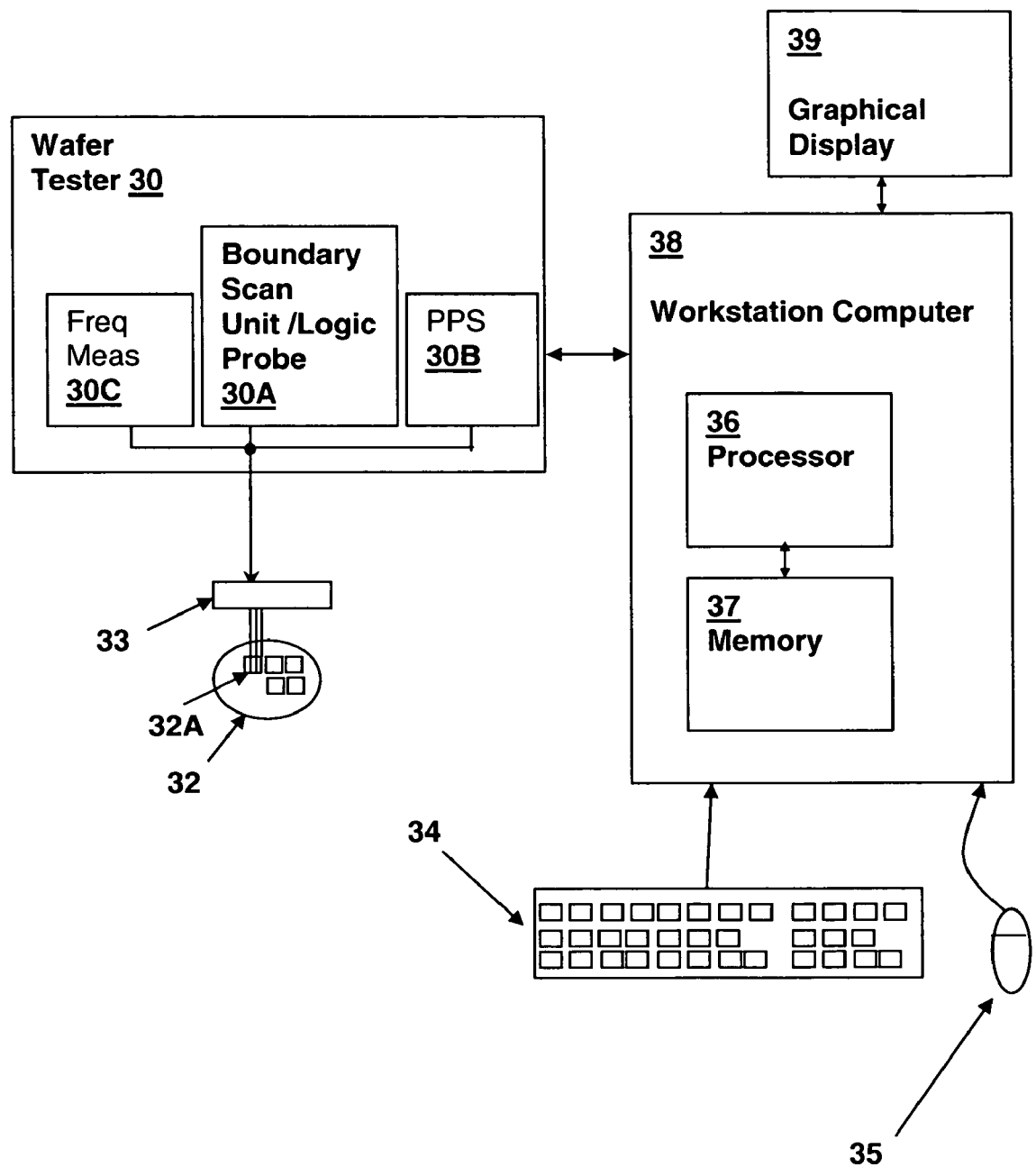
FIG. 3 is a block diagram of a wafer test system for testing a memory array via a method in accordance with an embodiment of the invention.

Referring now to FIG. 3, a VLSI wafer test system, in which methods according to an embodiment of the present invention are performed, is depicted. A wafer tester 30 includes a boundary scan unit 30A for providing stimulus to and retrieving data from a die 32A on a wafer under test 32 via a probe head 33 having electrical test connections to die 32A. Wafer tester 30 includes a frequency measurement unit 30C, that evaluates a frequency of the ring oscillator implemented by ring oscillator cells 10A. Wafer tester 30 also includes a programmable power supply 30B for supplying power supply rail voltage $V_{D1}$ and/or power supply voltage $V_{D2}$ to test memory cell 10A.

A workstation computer 38, having a processor 36 coupled to a memory 37, for executing program instructions from memory 37, wherein the program instructions include program instructions for receiving data produced by circuits within wafer 32 in accordance with an embodiment of the present invention, is coupled to wafer tester 30. The data produced by embodiments of the present invention are collected from multiple tests of test memory cells 10A within dies 32A as one or more of the test memory cell 10A power supply voltages are varied by programmable power supply 30B, and loading/leakage characteristics are changed by using boundary scan unit 30A to read/write test memory cell 10A values, connect additional columns to increase loading/leakage characteristics and to set the states of other memory cells 10 to observe changes in leakage due to the states of other memory cells 10 in relation to the state of test memory cell 10A. Measurement from analog or digital measurement subsystem 30C further increase the performance data set collected from measurements on test memory cell 10A. The results of all of the measurements can then be evaluated to either change the design of the array or memory cells 10, determine whether fabrication process has deviated exceedingly from tolerable norms or to determine operational ranges such as power supply voltage tolerances and access times.

Data from ring oscillator tests in accordance with embodiments of the invention are transferred to workstation computer 38 via wafer tester 30 and stored in memory 37 and/or other media storage such as a hard disk. Workstation computer 38 is also coupled to a graphical display 39 for displaying program output such as the results of memory tests described hereinafter. Workstation computer 38 is further coupled to input devices such as a mouse 35 and a keyboard 34 for receiving user input. Workstation computer may be coupled to a public network such as the Internet, or may be a private network such as the various "intra-nets" and software containing program instructions for analyzing data produced by methods and circuits in accordance with embodiments of the present invention may be located on remote computers or locally within workstation computer 38. Further, workstation computer 38 may be coupled to wafer tester by such a network connection.

While the system of FIG. 3 depicts a configuration suitable for sequential test of a plurality of dies on a wafer, the depicted system is illustrative and not limiting to the present invention. Probe head 33 may be a multi-die full wafer probe system, or may comprise multiple probe heads for simultaneously testing multiple wafers on a single or multiple die basis. Additionally, while boundary data retrieval and stimulus is illustrated, the techniques of the present invention may also be applied to other interfaces available to probe wafer 32, or applied to circuits implemented in fully functional dies where data extraction is performed over a serial or parallel bus or other interface.

Figure 4:
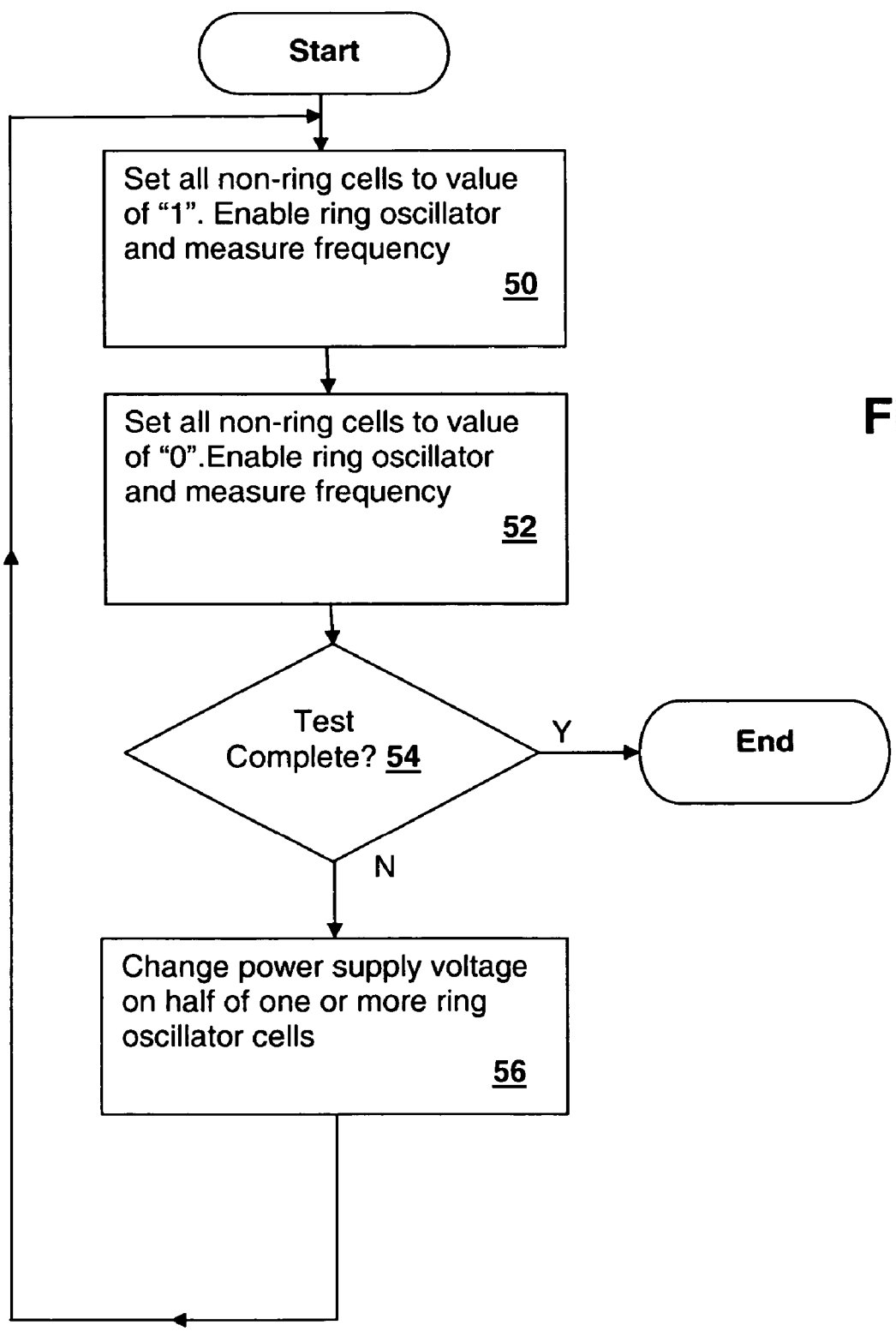
FIG. 4 is a flowchart depicting a method in accordance with an embodiment of the invention.

Referring now to FIG. 4, a method in accordance with an embodiment of the present invention is depicted in a flowchart. The depicted embodiment tests the two worst-case leakage polarities of the other memory cells 10 in the memory array, which may or may not have the worst-case effect on frequency of the ring oscillator. In general, a worst-case leakage test includes programming all of the other memory cells 10 to the same state, either all "1" or all "0". However, since the oscillation must necessarily change between states, the "0" state worst case leakage polarity of all the other cells should increase the delay of ring oscillator cell 10A for a change to a "1", but decrease the delay for changes back to "0". Therefore, the two worst case tests reveal more about any asymmetric effect from leakage rather than being a necessarily a true "worst case" delay condition. Therefore, it may be useful to study other combinations of values in the other memory cells 10 as well.

However, for simplicity, the illustrated method first sets all of the other memory cell 10 values to "1", enables the ring oscillator and a frequency measurement is taken (step 50). Then the other polarity is set in all of the other memory cells and another frequency measurement is taken (step 52). If all desired data is gathered and the test is complete (decision 54), then the method is finished. Otherwise, a parameter such as cell asymmetry is adjusted for example by changing the power supply voltage on half of one or more of ring oscillator cells 10A (step 56) and the tests in step 50 and step 52 are repeated.

Figure 5A:
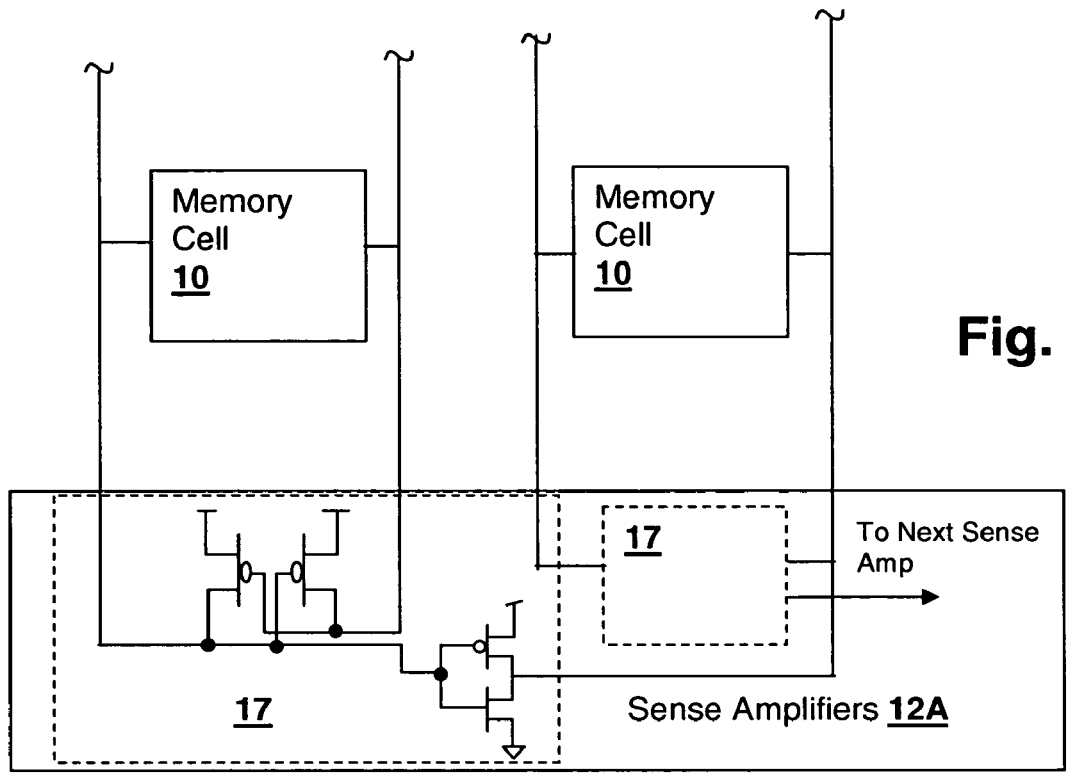
FIGS. 5A and 5B are schematic diagrams illustrating memory cell ring oscillators in accordance with alternative embodiments of the invention.

Referring now to FIG. 5A, an alternative connection of memory cells to form a ring oscillator is depicted. In the depicted embodiment, sense amplifiers 17 that are used to detect the states of the bitlines during memory read operations are tapped to feed a bitline from the next pair of bitlines in the array to form a ring oscillator. Further details of a sense amplifier that may be employed in the circuit of FIG. 5A are described in U.S. patent application "SRAM AND DUAL SINGLE ENDED BIT SENSE FOR AN SRAM", Ser. No. 11/055,416 filed on Feb. 10, 2005, the entire disclosure of which is herein incorporated by reference. The depicted embodiment permits characterization of the sense amplifier circuit in at least some of the tests performed on the memory array, so that the full loading of the sense amplifier circuit is present and so that the delays through the sense amplifiers can also be characterized.

Figure 5B:
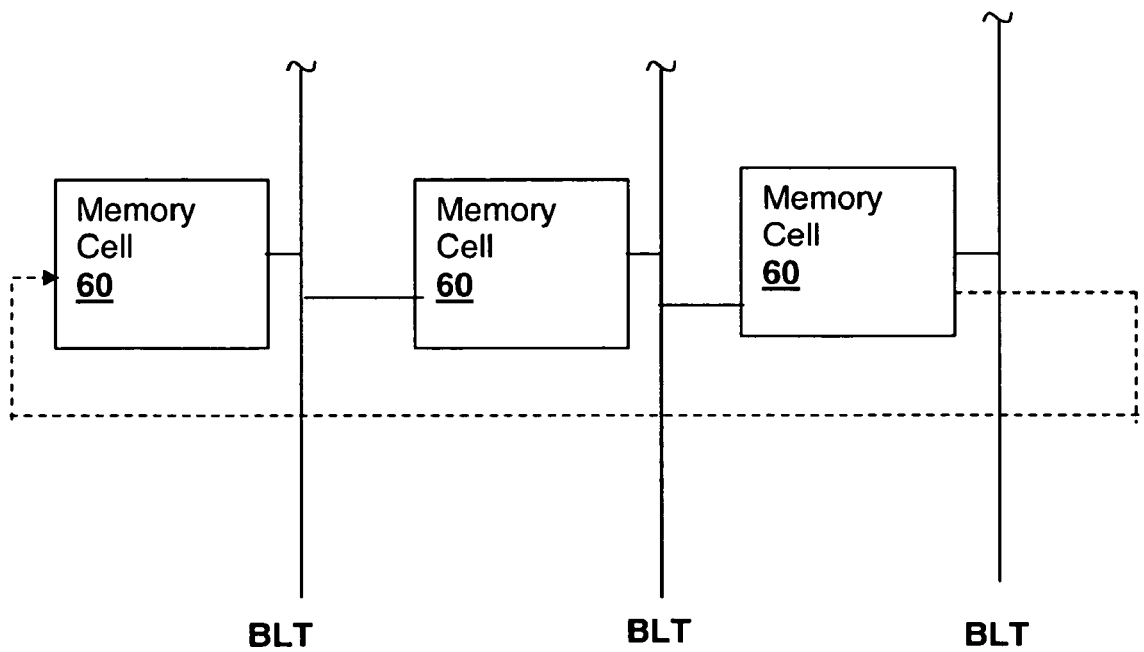

Referring now to FIG. 5B a memory row ring oscillator interconnection in a memory array in accordance with another embodiment of the present invention is shown. Memory cells 60 are of special design that permit a signal to be propagated on one of the bitlines provided for each column (TRUE bitline BLT as shown), simulating a write at the input to each cell and a read at the output of each cell.

Figure 6A:
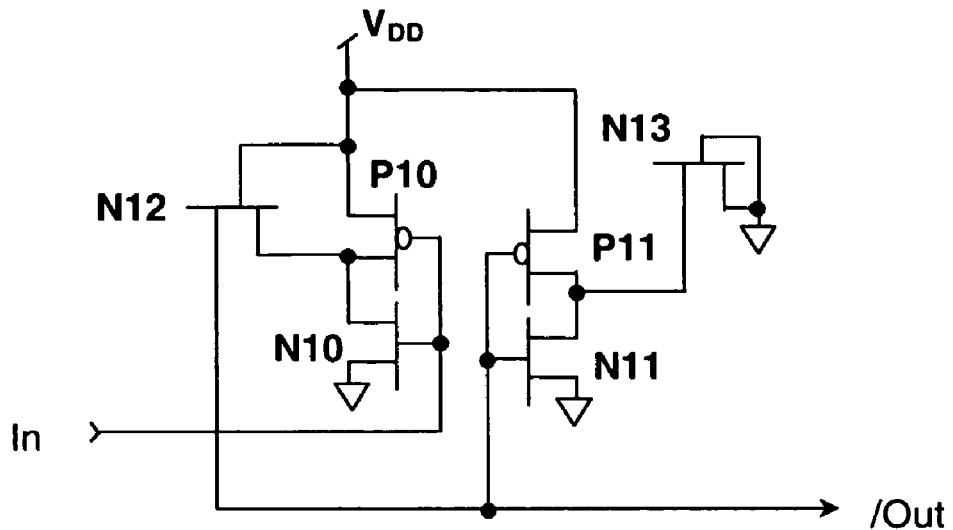
FIGS. 6A and 6B are schematic diagrams of ring oscillator memory cells in accordance with alternative embodiments of the present invention.
Figure 6B:
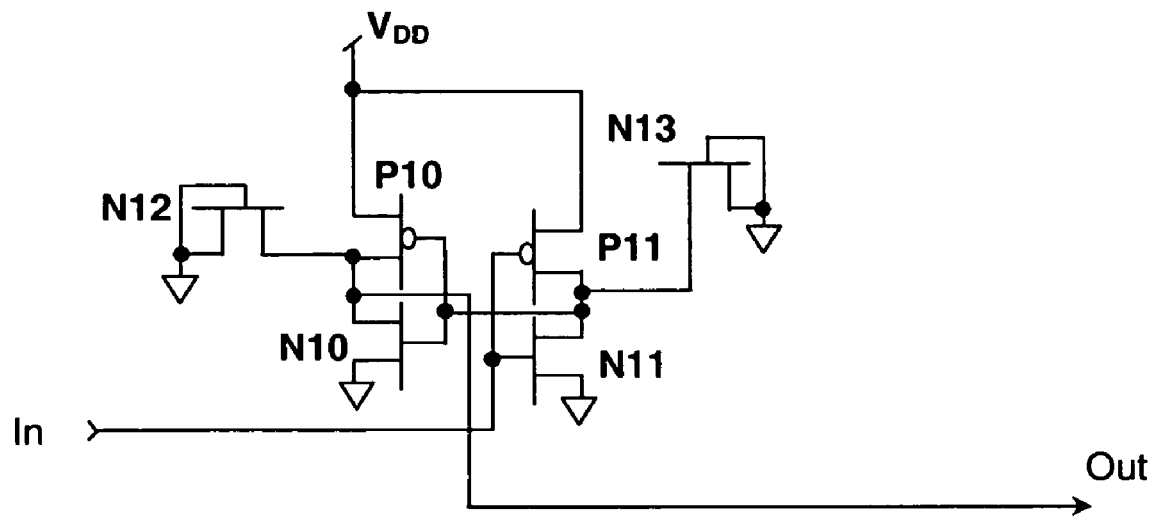

FIGS. 6A and 6B show cell designs suitable for use in the circuit of FIG. 5B. While for simplicity, the power supply connection is shown as a single connection, it will be understood that the split power supply connections and tests as described in the above-incorporated U.S. Patent Applications and shown in the memory cell circuit of FIG. 2B herein can be similarly applied to the circuits of FIGS. 6A and 6B. In particular, the read and write voltages of the circuit of FIG. 6B can be set to different values to test for weak read/weak write conditions as described above and in the above-incorporated U.S. Patent Applications.

FIG. 6A shows a cell that has the internal cross-coupled latch connection broken and passgate transistor N13 converted to a dummy loads by connecting its gate input and output channel connection to ground. The other passgate transistor N12 is enabled by connecting its gate connection to $V_{DD}$, but may also be connected to a static Ring Test Enable enable signal as shown in FIG. 1 so that the test circuit can be disabled and enabled from the column bitlines of a production memory array. The inverter formed by transistors N11, P11 is also connected as a dummy load and the inverter formed by transistors N10, P10 has its common gate connection connected to the In terminal. The memory cell of FIG. 6A thus provides an inverter that simulates actual memory cell capacitances and charge effects while providing an inverter that couples a "read" at the In input terminal to a "write" at the /Out output terminal, providing an inverted coupling between the BLT bitlines shown in the circuit of FIG. 5B, providing a measure of a combination of read/write delay of a standard memory cell in the frequency of the ring oscillator.

FIG. 6B shows a cell that has the internal cross-coupled connection intact and both passgate transistors N12 and N13 converted to a dummy loads by connecting their gate inputs and output channel connection to ground. The inverters formed by transistors N10, P10 and N11, P11 are effectively series-connected, providing a buffer that receives an input "write" at the In terminal and provide an output "write" at the Out output terminal. The memory cell of FIG. 6B thus provides a buffer that simulates actual memory cell capacitances and charge effects, providing a non-inverted coupling between the BLT bitlines shown in the circuit of FIG. 5B, providing a measure of a combination of read/write delay of a standard memory cell in the frequency of the ring oscillator.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method for measuring characteristics of a memory array, said method comprising:
   enabling a cascade of memory cells of a particular row of said memory array, wherein said memory cells form a ring oscillator having a frequency dependent on a loading provided by other rows of memory cells in said memory array;
   measuring a frequency of oscillation of said ring oscillator in order to determine a characteristic of said memory array; and
   adjusting a leakage present at outputs of said memory cell by changing a state of said other memory cells within said memory array, and wherein said measuring is performed for multiple leakage states selected by said adjusting, whereby said method determines an effect of said leakage on said frequency.

2. The method of claim 1, wherein said enabling enables a measurement mode that disables access to said other memory cells and further comprising:
   disabling said measurement mode to enable access to said other memory cells; and
   accessing said memory array to provide storage and retrieval of values to and from said memory array.

3. The method of claim 1, wherein said enabling is performed by:
   providing a connection between each bitline of said memory array and at least one internal node of a particular memory cell corresponding to a next column member of said particular row; and
   enabling an output of said particular memory cell onto a next bitline, whereby a state change at each bitline is propagated to said next bitline through said particular memory cell corresponding to said next column member of said particular row.

4. The method of claim 1, further comprising:
   setting an asymmetric relationship between inverter stages of a memory cell said memory array, wherein said inverter stages are crosscoupled to provide a storage latch; and
   observing an effect of said asymmetry on said frequency as said asymmetric relationship is varied.

5. The method of claim 4, wherein said setting is performed by adjusting a power supply rail voltage of one of said inverter stages with respect to another one of said inverter stages.

6. The method of claim 1, wherein said enabling is performed by:
   providing a connection between an output of a given sense amplifier having at least one input connected to a corresponding given bitline of said memory array and a next bitline of said memory array; and
   enabling an output of said sense amplifier onto said next bitline, whereby a state change at each bitline is propagated to said next bitline through said sense amplifier of said given row and said particular memory cell corresponding to said next column member of said particular row.

7. A method for measuring characteristics of a memory array, said method comprising:
   enabling a cascade of memory cells of a particular row of said memory array, wherein said memory cells form a ring oscillator having a frequency dependent on a loading provided by other rows of memory cells in said memory array; and
   measuring a frequency of oscillation of said ring oscillator in order to determine a characteristic of said memory array, and wherein said enabling is performed by providing a connection between an output of a given sense amplifier having at least one input connected to a corresponding given bitline of said memory array and a next bitline of said memory array, and enabling an output of said sense amplifier onto said next bitline, whereby a state change at each bitline is propagated to said next bitline through said sense amplifier of said given row and said particular memory cell corresponding to said next column member of said particular row.

8. The method of claim 7, wherein said enabling enables a measurement mode that disables access to said other memory cells and further comprising:
   disabling said measurement mode to enable access to said other memory cells; and
   accessing said memory array to provide storage and retrieval of values to and from said memory array.

9. The method of claim 7, wherein said enabling is performed by:
   providing a connection between each bitline of said memory array and at least one internal node of a particular memory cell corresponding to a next column member of said particular row; and
   enabling an output of said particular memory cell onto a next bitline, whereby a state change at each bitline is propagated to said next bitline through said particular memory cell corresponding to said next column member of said particular row.

10. The method of claim 7, further comprising:
    setting an asymmetric relationship between inverter stages of a memory cell said memory array, wherein said inverter stages are cross-coupled to provide a storage latch; and
    observing an effect of said asymmetry on said frequency as said asymmetric relationship is varied.

11. The method of claim 10, wherein said setting is performed by adjusting a power supply rail voltage of one of said inverter stages with respect to another one of said inverter stages.

12. The method of claim 7, further comprising adjusting a leakage present at outputs of said memory cell by changing a state of said other memory cells within said memory array, and wherein said measuring is performed for multiple leakage states selected by said adjusting, whereby said method determines an effect of said leakage on said frequency.

* * * * *